(12) United States Patent
Han et al.

(10) Patent No.: US 7,582,560 B2
(45) Date of Patent: Sep. 1, 2009

(54) METHOD FOR FABRICATING SEMICONDUCTOR DEVICE

(75) Inventors: Ky-Hyun Han, Kyoungki-do (KR); Ki-Won Nam, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 255 days.

(21) Appl. No.: 11/716,917

(22) Filed: Mar. 12, 2007

(65) Prior Publication Data

US 2007/0287293 A1 Dec. 13, 2007

(30) Foreign Application Priority Data

Jun. 29, 2006 (KR) .................. 10-2006-0059325
Nov. 30, 2006 (KR) .................. 10-2006-0120001

(51) Int. Cl.
*H01L 21/4763* (2006.01)

(52) U.S. Cl. ............... 438/637; 438/256; 438/620; 438/435; 438/700; 438/702; 257/E21.576

(58) Field of Classification Search ........... 438/256, 438/285, 399, 427, 435, 618, 620, 622, 634, 438/637, 700, 717, 734, 736, 739; 257/E21.576
See application file for complete search history.

(56) References Cited

U.S. PATENT DOCUMENTS 6,861,347 B2 * 3/2005 Lee et al. ............... 438/622

2001/0039114 A1 * 11/2001 Nakamura ............... 438/638
2006/0234457 A1 * 10/2006 Yoo ........................ 438/287
2007/0114633 A1 * 5/2007 Sandhu et al. ........... 257/513

FOREIGN PATENT DOCUMENTS

| KR | 10-2004-0001864 | 1/2004 |
|----|-----------------|--------|
| KR | 10-2005-0122068 | 12/2005 |
| KR | 10-2006-0000964 | 1/2006 |
| KR | 10-2006-0002182 | 1/2006 |

* cited by examiner

*Primary Examiner*—Davienne Monbleau
*Assistant Examiner*—Hajar Kolahdouzan
(74) *Attorney, Agent, or Firm*—Blakely, Sokoloff, Taylor & Zafman LLP

(57) ABSTRACT

A method for fabricating a semiconductor device includes preparing a substrate comprising a first surface and a second surface formed at a lower position than the first surface, forming an insulation layer over the substrate, etching the insulation layer to form a first contact hole exposing the first surface and a second contact hole having a larger depth than the first contact hole above the second surface, forming a first sacrificial layer over the insulation layer, the first contact hole, and the second contact hole, forming a second sacrificial layer over the substrate structure and filled in the first contact hole, exposing the first sacrificial layer at a bottom surface of the second contact hole while having the second sacrificial layer remain in the first contact hole, etching the first sacrificial layer, and etching the remaining insulation layer to expose the second surface.

20 Claims, 8 Drawing Sheets

US 7,582,560 B2

METHOD FOR FABRICATING SEMICONDUCTOR DEVICE

CROSS-REFERENCES TO RELATED APPLICATIONS

The present invention claims priority of Korean patent application numbers 10-2006-0059325 and 10-2006-0120001, filed on Jun. 29, 2006 and Nov. 30, 2006, respectively, which are incorporated by reference in their entirety.

BACKGROUND OF THE INVENTION

The present invention relates to a fabrication method of a semiconductor device, and more particularly, to a method for fabricating a semiconductor device that prevents a plate from being punched during an etching for forming a metal interconnection.

In a DRAM device, a metal interconnection is disposed over a device for inputting or outputting an electrical signal to/from the device. The metal interconnection is configured with a first metal interconnection M1 or a multi-layered structure having first to third metal interconnections M1 to M3, whereby the electrical signal is inputted or outputted therethrough. A lowermost metal interconnection among the multi-layered metal interconnections is generally called 'first metal interconnection M1'. The first metal interconnection M1 is connected to underlying components, e.g., particularly, a capacitor and a bit line, through a first metal contact M1C. Here, an etching process for forming the first metal contact M1C is called 'M1C etching', which is used for forming a deep contact hole. In general, the M1C etching process is performed to form a contact hole by etching upper portions of a plate and a bit line for supplying a power to the plate and the bit line, wherein the plate is disposed over a storage node.

FIG. 1 illustrates a cross-sectional view of a typical method for fabricating a semiconductor device. Landing plug contacts 13 are formed on a substrate 11 having a cell region and a peripheral region, wherein the landing plug contacts 13 are insulated from each other by virtue of a first inter-layer insulation layer 12. A second inter-layer insulation layer 14 is formed, and a bit line BL is formed on the second inter-layer insulation layer 14. The bit line BL is simultaneously formed in the cell region and the peripheral region, wherein the bit line BL is configured with a tungsten layer 15A and a bit line hard mask nitride layer 15B, which are stacked in sequence. After forming a third inter-layer insulation layer 16 over the bit line BL, a storage node contact 17 penetrating the third and second inter-layer insulation layers 16 and 14 are formed such that the storage node contact 17 is connected to the landing plug contact 13.

An etch barrier nitride layer 18 and a fourth inter-layer insulation layer 19 are formed on the third inter-layer insulation layer 16. The fourth inter-layer insulation layer 19 and the etch barrier nitride layer 18 are sequentially etched to expose a portion of the cell region where a storage of a capacitor will be formed. A storage node 20 connected to the storage node contact 17 is formed. A dielectric layer 21 and a plate 22 are sequentially formed on the storage node 20. The plate 22 is formed of a TiN layer and a polysilicon layer, which are stacked in sequence. A fifth inter-layer insulation layer 23 is formed over the plate 22, and thereafter an M1C etching is performed. At this time, the M1C etching is simultaneously performed on the cell and peripheral region to thereby form contact holes 24A and 24B exposing a surface of the plate 22 and a surface of the tungsten layer 15A of the bit line BL.

In the typical method for fabricating the semiconductor device, since the plate 22 is disposed over the storage node 20 and the bit line BL is disposed below the storage node contact under the storage node 20, a step height between the plate 22 and the bit line BL becomes too great, e.g., approximately 30,000 Å. Therefore, according to the typical method, when the M1C etching is simultaneously performed on the cell region and the peripheral region for etching the bit line BL, a conductive layer of the plate 22 cannot be resistant to the etching so that the conductive layer is punched therethrough (this is often called punch phenomenon).

FIG. 2 illustrates a micrograph showing a punch phenomenon of a plate according to the typical method. It is understood that there occurs a punch phenomenon of the plate when simultaneously performing the M1C etching on the bit line and the plate. The reason the punch phenomenon occurs is that there exists a great step height between the plate and the bit line. That is, since the polysilicon layer and the TiN layer as the conductive material for the plate have high etch selectivity with respect to an oxide layer, the etching rate is slow when the M1C etching is performed up to the top portion of the bit line. However, an etching time should be increased due to a great step height, which causes the plate to be punched.

Because the punch phenomenon does not have an effect on a device fabrication, following processes are still performed even after the plate is punched, in the typical method. However, as the device is miniaturized, a sidewall of the plate is partially oxidized if the plate is punched. Accordingly, a cleaning process cannot be performed well, which increases a contact resistance in depositing a barrier metal layer, i.e., a portion of a first metal interconnection M1. In the long run, a resistance of the plate is increased.

Thus, to avoid such a limitation, the contact holes over the plate and the bit line may be formed through respective etching processes. This leads to long process time and high fabrication cost. As another method to avoid the limitation, there has been proposed a method for increasing etch selectivity between the TiN layer and the polysilicon layer by changing plasma gas. This typical method, however, is difficult to overcome the above limitation due to a great step height between the plate and the bit line.

SUMMARY OF THE INVENTION

Embodiments of the present invention are directed to provide a method for fabricating a semiconductor device, which can prevent a punch phenomenon of a plate when simultaneously performing an M1C etching on the plate and a bit line.

In accordance with an aspect of the present invention, there is provided method for fabricating a semiconductor device, including: preparing a substrate comprising a first surface and a second surface formed at a lower position than the first surface; forming an insulation layer over the substrate; etching the insulation layer to form a first contact hole exposing the first surface and a second contact hole having a larger depth than the first contact hole above the second surface; forming a first sacrificial layer over the insulation layer, the first contact hole, and the second contact hole; forming a second sacrificial layer over the substrate structure and filled in the first contact hole; exposing the first sacrificial layer at a bottom surface of the second contact hole while having the second sacrificial layer remain in the first contact hole; etching the first sacrificial layer; and etching the remaining insulation layer to expose the second surface.

In accordance with another aspect of the present invention, there is provided method for fabricating a semiconductor device, including: preparing a substrate comprising a plate and a bit line formed at a lower position than the plate; forming an insulation layer over the substrate; etching the insulation layer to form a first contact hole exposing a surface of the plate and a second contact hole having a larger depth than the first contact hole above the bit line; forming a first sacrificial layer over the insulation layer, the first contact hole, and the second contact hole; forming a second sacrificial layer over the substrate structure and filled in the first contact hole; exposing the first sacrificial layer at a bottom surface of the second contact hole while having the second sacrificial layer remain in the first contact hole; etching the exposed first sacrificial layer; and etching the remaining insulation layer to expose a surface of the bit line.

DESCRIPTION OF SPECIFIC EMBODIMENTS

FIGS. 3A to 3F illustrate cross-sectional views of a method for fabricating a semiconductor device in accordance with an embodiment of the present invention.

Figure 1:
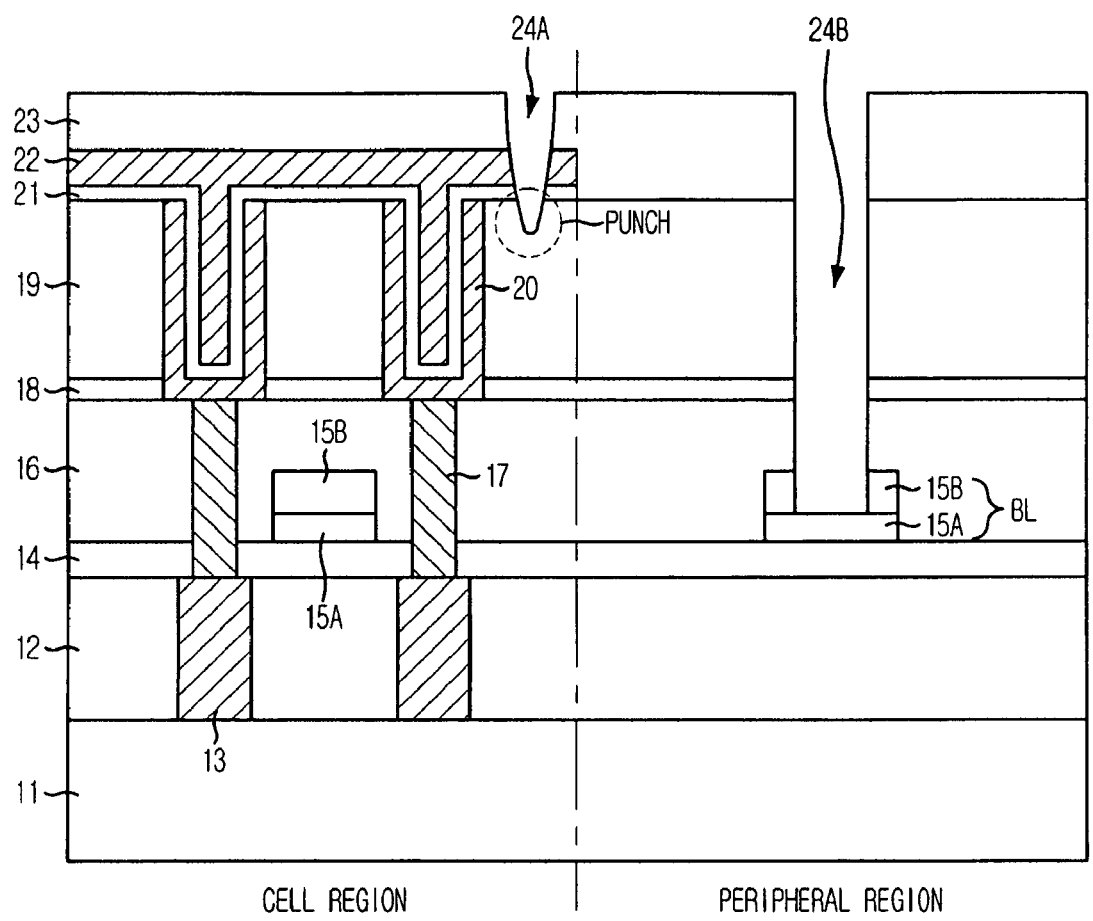
FIG. 1 illustrates a cross-sectional view of a typical method for fabricating a semiconductor device.
Figure 2:
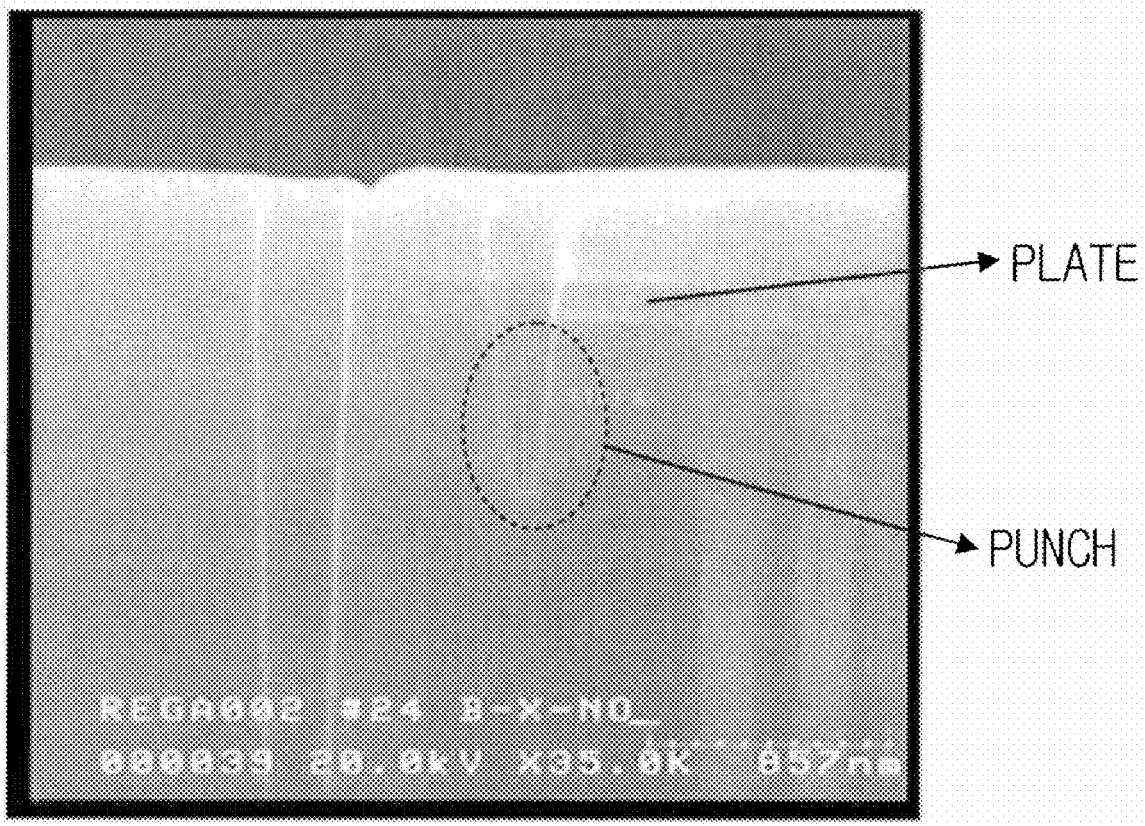
FIG. 2 illustrates a micrograph showing a punch phenomenon of a plate according to the typical method.
Figure 3A:
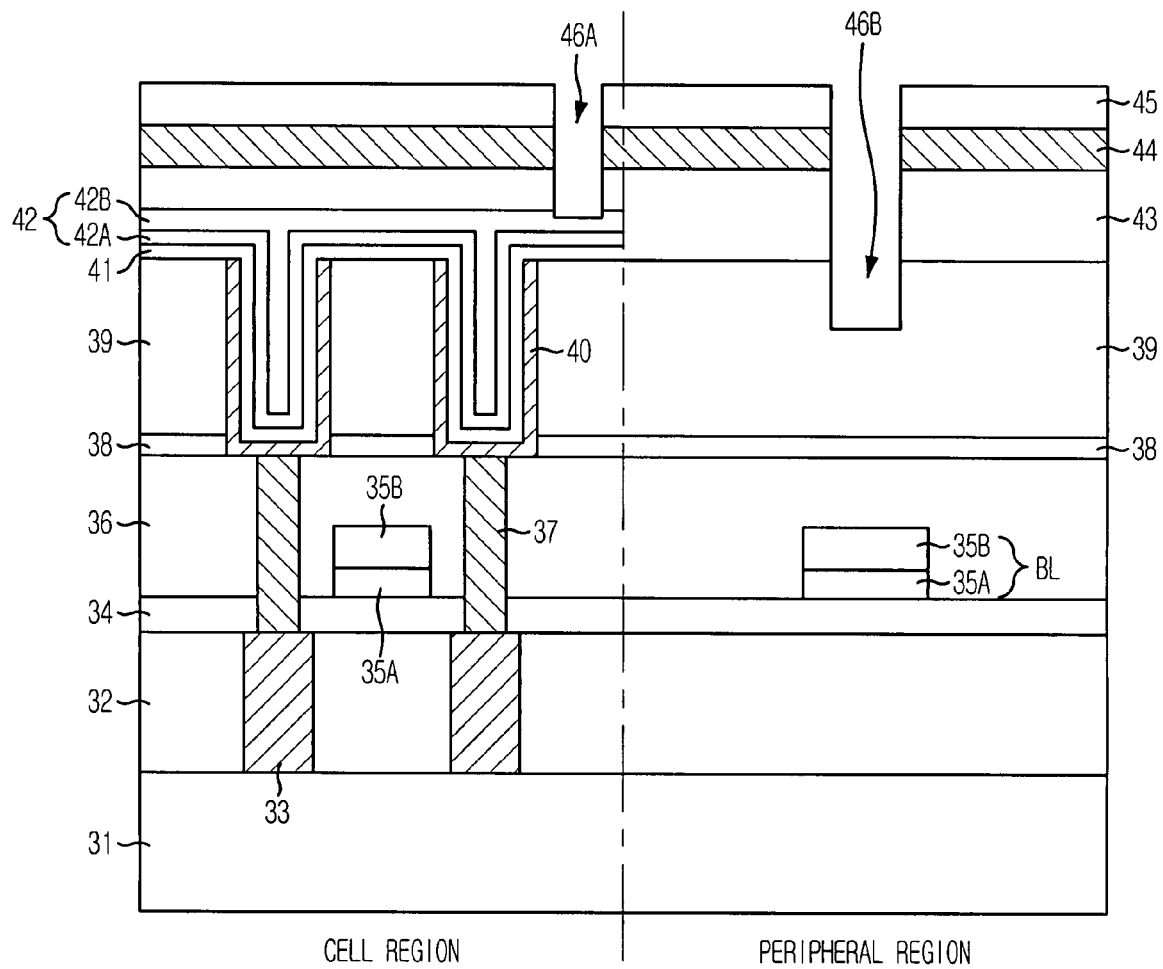
FIGS. 3A to 3F illustrate cross-sectional views of a method for fabricating a semiconductor device in accordance with an embodiment of the present invention.

Referring to FIG. 3A, landing plug contacts 33 are formed on a substrate 31 having a cell region and a peripheral region, wherein the landing plug contacts 13 are insulated from each other by virtue of a first inter-layer insulation layer 32. Specifically, the first inter-layer insulation layer 32 is etched to form a contact hole, and thereafter a polysilicon layer is deposited and then patterned to form the landing plug contacts 33. Before forming the landing plug contacts 33, a transistor configured with a gate, a source and a drain may be formed. A second inter-layer insulation layer 34 is formed, and a bit line BL is formed on the second inter-layer insulation layer 34. The bit line BL is simultaneously formed in the cell region and the peripheral region, wherein the bit line BL is configured with a tungsten layer 35A and a bit line hard mask nitride layer 35B, which are stacked in sequence.

After forming a third inter-layer insulation layer 36 over the bit line BL, a storage node contact 37 penetrating the third and second inter-layer insulation layers 36 and 34 are formed such that the storage node contact 37 is connected to the landing plug contact 33. Specifically, the third and second inter-layer insulation layers 36 and 34 are etched to form a storage node contact hole, and thereafter a polysilicon layer is deposited and then patterned to form the storage node contact 37. An etch barrier nitride layer 38 and a fourth inter-layer insulation layer 39 are formed on the third inter-layer insulation layer 36. Here, the etch barrier nitride layer 38 is formed of silicon nitride ($Si_3N_4$)

The fourth inter-layer insulation layer 39 and the etch barrier nitride layer 38 are sequentially etched to expose a portion of the cell region where a storage node of a capacitor will be formed. A storage node 40 connected to the storage node contact 37 is formed. Here, the storage node 40 has a cylinder shape and is formed of a metal such as polysilicon or platinum (Pt). A dielectric layer 41 and a plate 42 are sequentially formed on the storage node 40. The plate 42 is configured with a TiN layer 42A and a polysilicon layer 42B, which are stacked in sequence.

A subsequent M1C process, that is, an M1C etching process, will be performed after the process for the capacitor including the plate 42 is performed. The plate 42 and the bit line BL, on which the M1C process will be performed, are formed at different heights to each other within the substrate structure. That is, the bit line BL is formed at a lower position than the plate 42. Thus, subsequent contact holes will be formed with different depths during the subsequent M1C process.

A fifth inter-layer insulation layer 43 is formed over the plate 42, and thereafter an M1C etching is performed. A hard mask 44 is formed for performing the M1C etching, and a contact mask 45 is then formed on the hard mask 44 using a photoresist layer. For example, since the inter-layer insulation layers that will undergo the M1C etching are very thick, an etch selectivity is not sufficient in case of using only the photoresist layer. Therefore, after forming the hard mask 44 formed of one selected from the group consisting of nitride, silicon rich oxynitride, polysilicon, amorphous carbon, and tungsten, the contact mask 45 is patterned using the photoresist layer.

The M1C etching is simultaneously performed on the cell region and the peripheral region using the contact mask 45 as an etch barrier, the M1C etching may be mainly divided into an etching process of the fifth inter-layer insulation layer 43 over the plate 42, and an etching process of the third inter-layer insulation layer 36, the etch barrier nitride layer 38 and the fourth inter-layer insulation layer 39 over the bit line BL. A portion (fifth inter-layer insulation layer) of a multi-layered insulating structure between the plate 42 and the bit line is etched in advance, and thereafter other insulating layers (third inter-layer insulation layer, etch barrier nitride layer and fourth inter-layer insulation layer) are etched.

In detail, a first dry etch is performed first. Here, the first dry etch is performed until a surface of the plate 42 is exposed. In particular, an over etch is performed for securing sufficient etching. The surface of the plate 42 has an etch rate five times slower than the oxide layer, because the upper layer of the plate 42 is the polysilicon layer 42B. Thus, the etching is very rapidly performed up to the top surface of the bit line but the etching of the plate 42 is stopped at the polysilicon layer 42B although the over etch is performed. Consequently, there occurs a depth difference between contact holes respectively formed in the cell region and the peripheral region.

A first contact hole 46A and a second contact hole 46B are formed through the first dry etch. Here, the first contact hole 46A exposes the surface of the plate 42, and the second contact holes 46B is formed to a certain depth over the bit line BL of the peripheral region. It is noticed that the second contact hole 46B does not expose the surface of the bit line BL.

For instance, the first dry etch may be performed using a mixed gas of oxygen ($O_2$), fluoroform ($CHF_3$) and $C_4F_6$, and thus the etching of oxide material is rapidly performed. In detail, the first dry etch is self-alignedly performed under conditions of the $CHF_3$ flow rate ranging from approximately 30 sccm to approximately 50 sccm, the $C_4F_6$ flow rate ranging from approximately 80 sccm to approximately 150 sccm, and the $O_2$ flow rate ranging from approximately 1 to approximately 5 sccm.

Figure 3B:
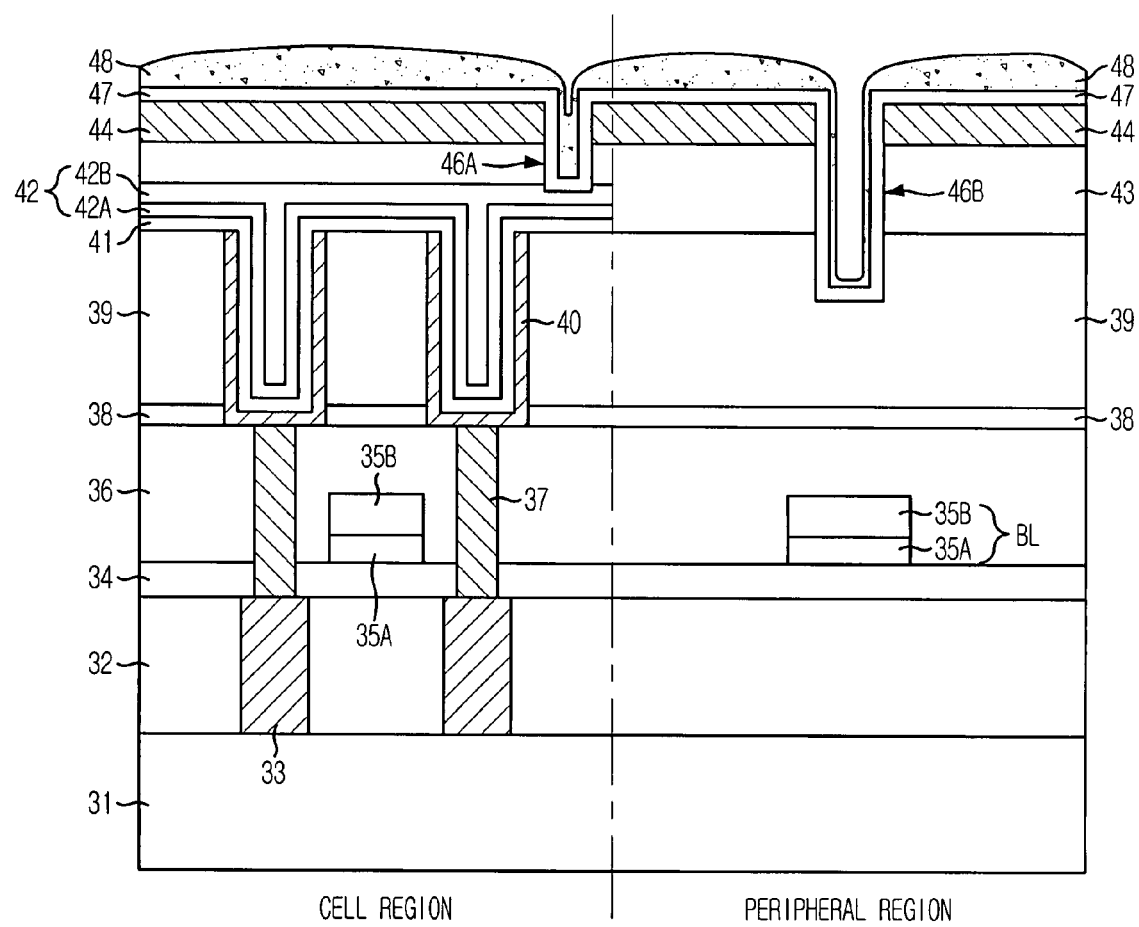

Referring to FIG. 3B, after removing the contact mask 45, a first sacrificial layer 47 is deposited to a thickness ranging from approximately 100 Å to approximately 300 Å on the resultant structure including the first and second contact holes 46A and 46B. The first sacrificial layer 47 is formed of nitride, e.g., silicon nitride ($Si_3N_4$). The first sacrificial layer 47 is conformally deposited on entire surface.

A second sacrificial layer 48 is formed on the first sacrificial layer 47. For instance, the second sacrificial layer 48 is formed of an oxide, e.g., an undoped silicate glass (USG) that is known as an undoped oxide layer, using plasma enhanced chemical vapor deposition (PECVD) process. When depositing the USG layer using the PECVD process, a step coverage is poor. For example, the USG layer is deposited such that the USG layer fills the first contact hole 46A over the plate 42 and incompletely fills the second contact hole 46B over the bit line by controlling the step coverage during the deposition of the USG layer. That is, a thickness of the USG layer deposited into the first contact hole 46A over the plate 42 is greater, e.g., five times, than a thickness of the USG layer filled into the second contact hole 46B over the bit line BL. It is possible to control this thickness difference of the USG layer because the first contact hole 46A over the plate 42 is shallower than the second contact hole 46B over the bit line.

The second sacrificial layer 48 may be formed to a thickness of at least approximately 300 Å or greater, e.g., in the range of approximately 300 Å to approximately 500 Å, inside the first contact hole 46A over the plate 42. Therefore, the second sacrificial layer 48 inside the second contact hole 46B over the bit line has a smaller thickness, e.g., in the range of approximately 60 Å to approximately 100 Å. The second sacrificial layer 48 is deposited relatively thicker on other surfaces except for the first and second contact holes 46A and 46B, and thus the second sacrificial layer 48 has an overhang structure.

Figure 3C:
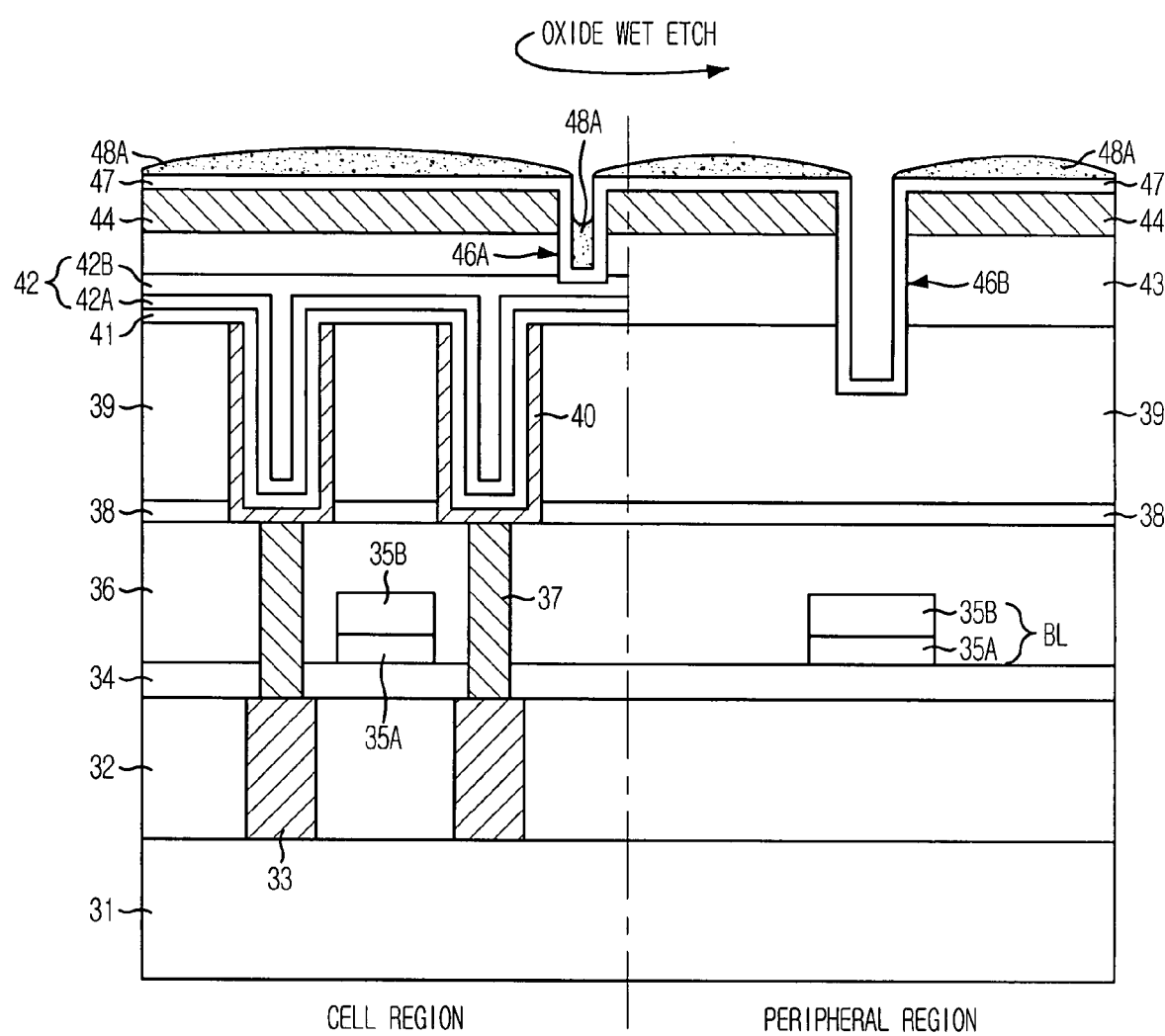

Referring to FIG. 3C an oxide wet-etch is performed to remove the second sacrificial layer 48 in the second contact hole 46B. Here, because the second sacrificial layer 48 is thickly formed in the first contact hole 46A over the plate 42, a residual second sacrificial layer 48A with a certain thickness is still left remaining in the first contact hole 46A over the plate even after the second sacrificial layer 48 in the second contact hole 46B is all removed. Accordingly, both the first sacrificial layer 47 and the residual second sacrificial layer 48A remain in the first contact hole 46A, but only the first sacrificial layer 47 remains in the second contact hole 46B over the bit line.

Since the second sacrificial layer 48 is formed of oxide material, the oxide wet-etch may be performed for an appropriate time by mixing deionized water ($H_2O$) and hydrogen fluoride (HF) under condition that a volume ratio of $H_2O$ to HF ranges approximately 15-25:1. Through the oxide wet-etch, the residual second sacrificial layer 48A is left remaining inside the first contact hole 46A such that the residual second sacrificial layer 48A has a thickness of at least approximately 200 Å or greater, but the second sacrificial layer 48 is all removed in the second contact hole 46B over the bit line BL. Here, since the first sacrificial layer 47 in the second contact hole 46B is a nitride layer, the first sacrificial layer 47 is not removed during the oxide wet-etch.

Meanwhile, an oxide dry etch may be employed for removing the second sacrificial layer 48 in the second contact hole 46B. In this case, since the second sacrificial layer 48 in the first contact hole 46A has much greater thickness than the second sacrificial layer 48 in the second contact hole 46B, the residual second sacrificial layer 48A with a thickness of at least approximately 200 Å or greater may be left remaining in the first contact hole 46A even after second sacrificial layer 48 in the second contact hole 46B is all removed.

Figure 3D:
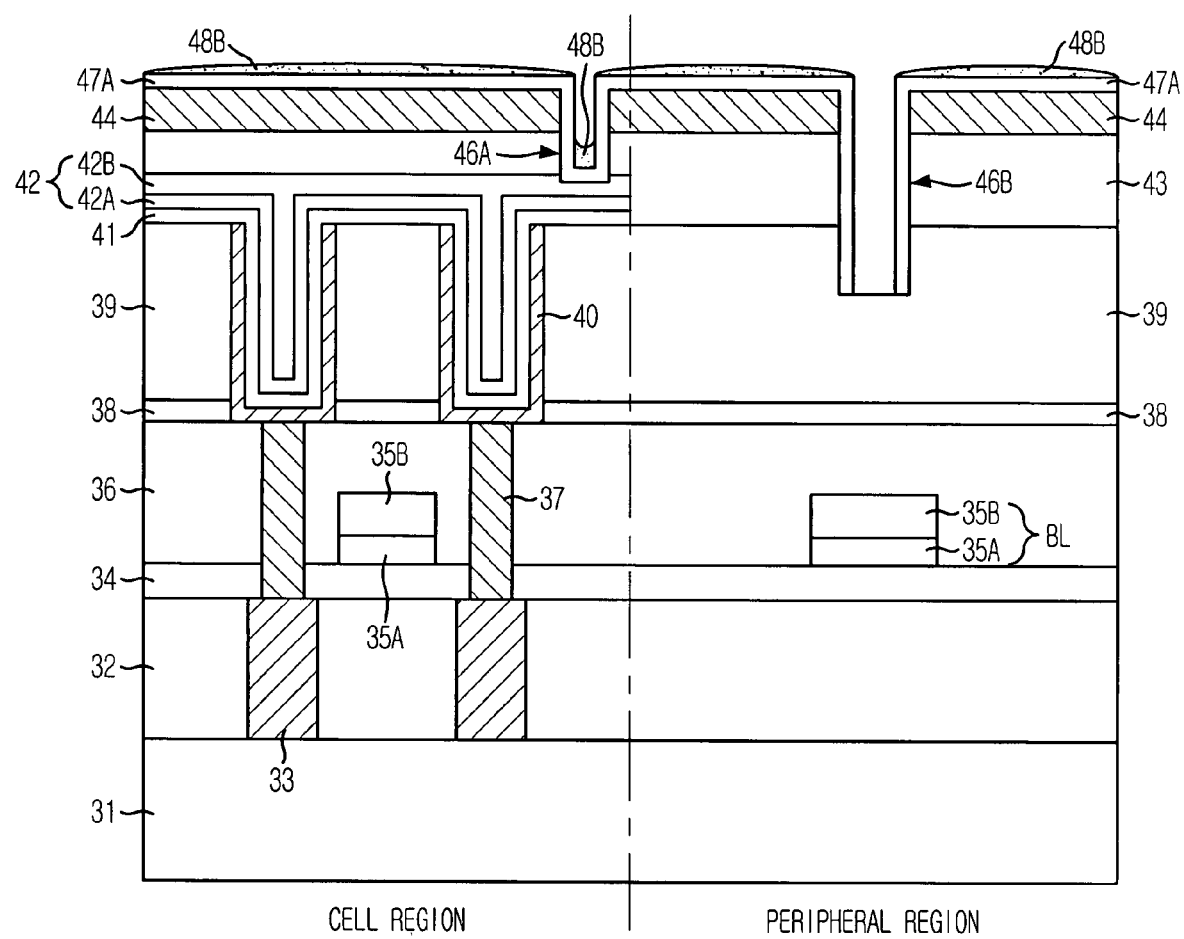

Referring to FIG. 3D, the first sacrificial layer 47 exposed through the second contact hole 46B is etched, forming a remaining first sacrificial layer 47A. Here, because the first sacrificial layer 47 is formed of nitride, the etching of the first sacrificial layer 47 is performed under conditions of a top power of approximately 1,000 W or greater (e.g., in the range of approximately 1,000 W to approximately 3,000 W), a bottom power of approximately 300 W or smaller (e.g., in the range of approximately 10 W to approximately 300 W), using a mixed gas of $O_2$ and $CF_4$ or a mixed gas of $O_2$ and $NF_3$. When using the mixed gas of $O_2$ and $CF_4$, the $O_2$ flow rate ranges from approximately 10 sccm to approximately 30 sccm, and the $CF_4$ flow rate ranges from 50 sccm to approximately 120 sccm. When using the mixed gas of $O_2$ and $NF_3$, the $O_2$ flow rate ranges from approximately 10 sccm to approximately 30 sccm, and the $NF_3$ flow rate ranges from 50 sccm to approximately 120 sccm.

Under such a condition, the etch selectivity between the nitride layer and the oxide layer is at least approximately 1:1 or greater, the nitride layer is more rapidly etched than the oxide layer. Therefore, the first sacrificial layer 47 on the bottom of the second contact hole 46B is etched but the residual second sacrificial layer 48A still covers the first sacrificial layer 47 thereunder although the residual second sacrificial layer 48A in the first contact hole 46A is partially etched, whereby the first sacrificial layer 47 in the first contact hole 46A is not etched. Reference denotation 48B represents a remaining second sacrificial layer.

Figure 3E:
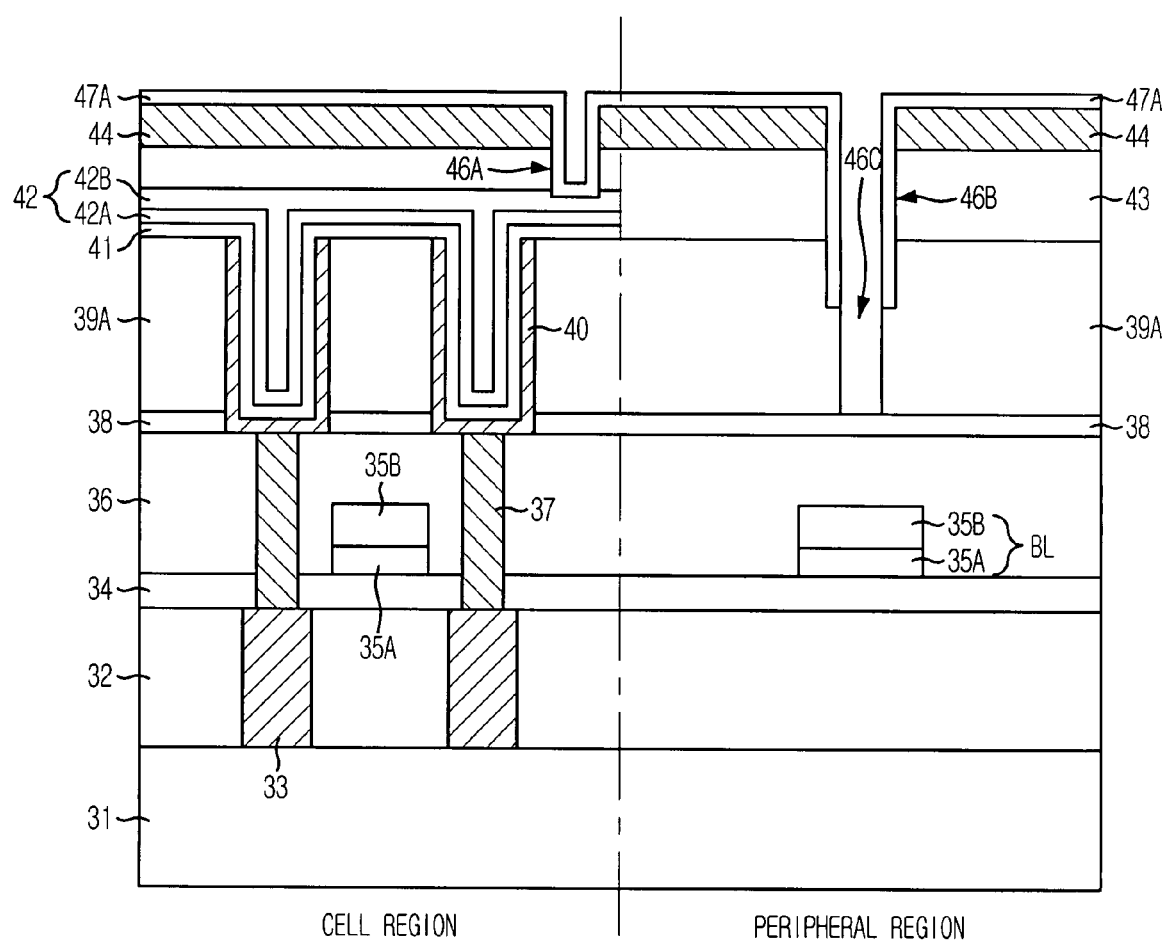

Referring to FIG. 3E, a second dry etch is performed under substantially the same condition as the first dry etch. The second dry etch is performed using a mixed gas of $O_2$, $CHF_3$ and $C_4F_6$ on condition that an etch selectivity of the oxide to the nitride is approximately 10:1. Therefore, the etching of the oxide material is very rapidly performed. The second dry etch is self-alignedly performed under condition of the $CHF_3$ flow rate ranging from approximately 30 sccm to approximately 50 sccm, the $C_4F_6$ flow rate ranging from approximately 80 sccm to approximately 150 sccm, and the $O_2$ flow rate ranging from approximately 1 to approximately 5 sccm.

During the second dry etch, the remaining second sacrificial layer 48B is etched in the first contact hole 46A over the plate 42 but the remaining first sacrificial layer 47A under the remaining second sacrificial layer 48B is not etched. That is, the remaining first sacrificial layer 47A remains over the plate 42 during the second dry etch so that the remaining first sacrificial layer 47A acts as an etch barrier for preventing the plate 42 from being punched. The fourth inter-layer insulation layer 39 formed of oxide material is etched until the etching is stopped at the etch barrier nitride layer 38 under the second contact hole 46B, whereby a third contact hole 46C is formed over the bit line BL. Reference denotation 39A represents a patterned fourth inter-layer insulation layer.

As described above, since the second dry etch is performed using the remaining first sacrificial layer 47A remaining over the plate 42 as an etch barrier, it is possible to prevent the plate 42 from being punched. Meanwhile, the remaining second sacrificial layer 48B does not remain at all or remains such that the remaining second sacrificial layer 48B has a small thickness, because the second dry etch rapidly etches the oxide layer.

Figure 3F:
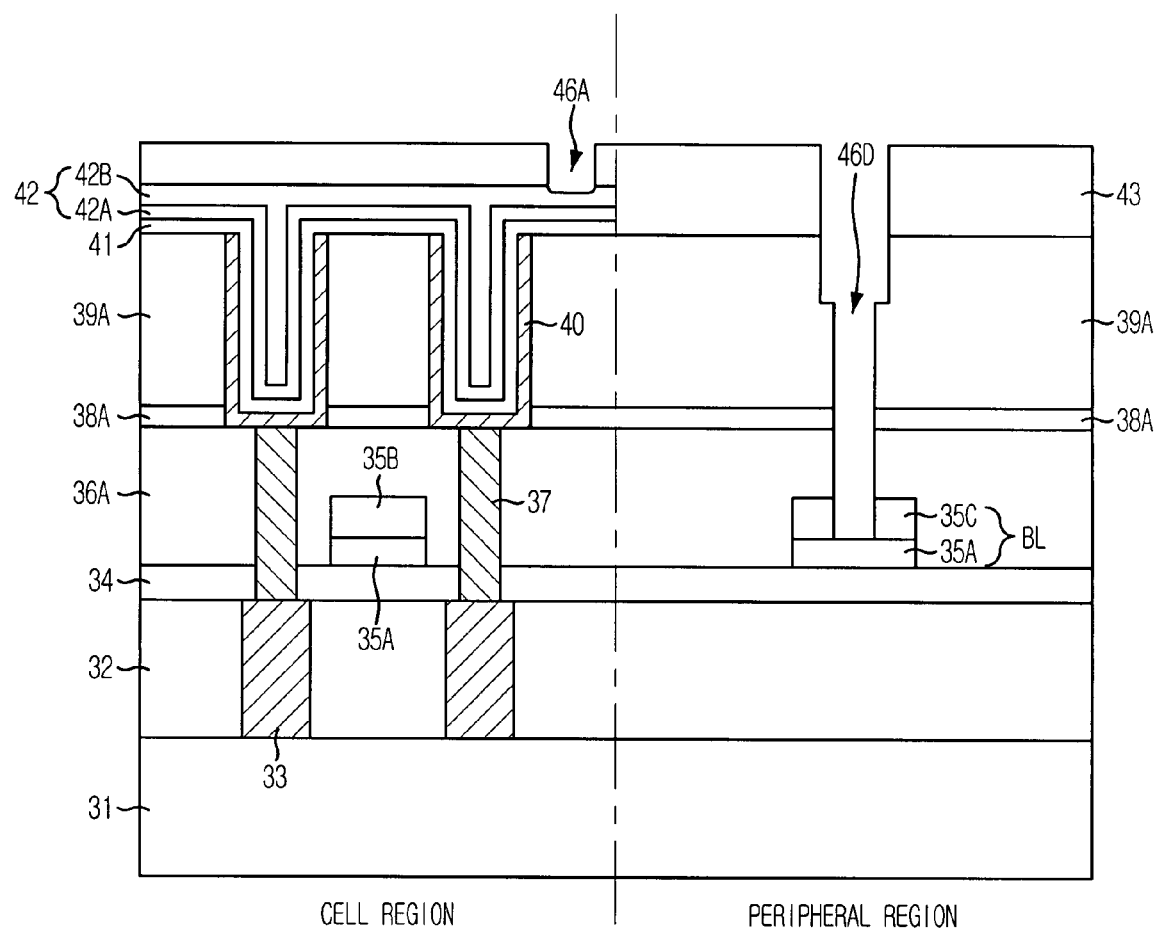

Referring to FIG. 3F, an etching process is performed in-situ using carbon fluoride based gas such as $C_4F_6$ until the conductive layer of the bit line BL, i.e., the tungsten 35A, is exposed, thereby forming a fourth contact hole 46D. Reference denotations 38A, 36A, and 35C represent a patterned etch barrier nitride layer, a patterned third inter-layer insulation layer, and a patterned bit line hard mask nitride layer, respectively. The etching of the bit line hard mask nitride layer 35B is performed such that the remaining first sacrificial layer 47A and the hard mask 44 over the plate 42 are simultaneously removed. Thus, the remaining first sacrificial layer 47A and the hard mask 44 are also removed simultaneously in the peripheral region.

The etching process for forming the fourth contact hole 46D includes: etching the etching barrier nitride layer 38; etching the third inter-layer insulation layer 36; and etching the bit line hard mask nitride layer 35B. First, when etching the etch barrier nitride layer 38, the remaining first sacrificial layer 47A over the plate 42 is also removed at substantially the same time so that the first sacrificial layer does not remain over the plate 42 any longer.

The third inter-layer insulation layer 36 is etched until the bit line hard mask nitride layer 35B is exposed, and subsequently the bit line hard mask nitride layer 35B is etched. Herein, when etching the bit line hard mask nitride layer 35B, the remaining first sacrificial layer 47A remaining in the cell and peripheral regions are all etched so that they do not remain.

Meanwhile, the plate 42 may be exposed while etching the third inter-layer insulation layer 36 and the bit line hard mask nitride layer 35B. However, since the TiN layer 42A and the polysilicon 42B used as the plate 42 has a high etch selectivity with respect to the oxide and nitride layer, the etching rate of the plate 42 is slow so that there does not occur a punch phenomenon. That is, while the plate 42 is being exposed to the etching process, a step height that will be etched by is correspondent to a total thickness of the third inter-layer insulation layer 36 and the bit line hard mask nitride layer 35B. Thus, the etch target is too small. Even if the polysilicon 42B may be etched, the TiN layer 42A still remains under the first contact hole 46A when the fourth contact hole 46D is being formed, which makes it possible to prevent the plate 42 from being punched.

In accordance with the embodiments as described above, the M1C etching is performed two times by employing a nitride material as the first sacrificial layer and an oxide material as the second sacrificial layer. Therefore, even when the M1C etching is simultaneously performed over the plate and the bit line, it is possible to prevent the plate from being punched, which may be caused by a large step height.

This invention may be applied in most methods for fabricating a semiconductor device which simultaneously exposes contact holes with different depths, in addition to the above process for opening the contact holes above the plate and the bit line. Accordingly, the region with a shallow depth (referred to as a first surface) may not be punched while opening a contact hole at the region with a deep depth (referred to as a second surface).

While the present invention has been described with respect to the specific embodiments, it will be apparent to those skilled in the art that various changes and modifications may be made without departing from the spirit and scope of the invention as defined in the following claims.

What is claimed is:

1. A method of fabricating a semiconductor device, the method comprising:
   preparing a substrate comprising a first surface and a second surface formed at a lower position than the first surface;
   forming an insulation layer over the substrate;
   etching the insulation layer to form a first contact hole exposing the first surface and a second contact hole having a larger depth than the first contact hole above the second surface;
   forming a first sacrificial layer over the insulation layer, the first contact hole, and the second contact hole;
   forming a second sacrificial layer over the substrate and filled in the first contact hole;
   exposing the first sacrificial layer at a bottom of the second contact hole while having the second sacrificial layer remain in the first contact hole;
   etching the first sacrificial layer at the bottom of the second contact hole the remaining second sacrificial layer formed over the first sacrificial layer in the first contact hole is partially etched such that the first sacrificial layer at a bottom of the first contact hole is not etched; and
   etching the remaining insulation layer to expose the second surface while the remaining second sacrificial layer in the first contact hole is etched but a portion of the first sacrificial layer under the remaining second sacrificial layer in the first contact hole is not etched.

2. The method of claim 1, wherein the first sacrificial layer comprises a nitride-based layer and the second sacrificial layer comprises an oxide-based layer.

3. The method of claim 2, wherein the second sacrificial layer comprises an undoped silicate glass (USG) layer.

4. The method of claim 3, wherein exposing the first sacrificial layer at the bottom of the second contact hole while having the second sacrificial layer remain in the first contact hole comprises wet etching or dry etching the second sacrificial layer.

5. The method of claim 4, wherein the wet etching comprises using deionized water ($H_2O$) and hydrogen fluoride (HF) mixed at a ratio ranging approximately 15-25:1.

6. The method of claim 2, wherein the first sacrificial layer is formed to substantially the same thickness over surfaces of the first contact hole and the second contact hole.

7. The method of claim 1, wherein etching the insulation layer to form the first contact hole exposing the first surface and the second contact hole having the larger depth than the first contact hole comprises:
   forming a hard mask pattern over the insulation layer; and
   etching the insulation layer to form the first contact hole and the second contact hole at substantially the same time using the hard mask pattern as an etch barrier.

8. The method of claim 7, wherein the hard mask pattern comprises one selected from a group consisting of nitride, silicon rich oxynitride, polysilicon, amorphous carbon, and tungsten.

9. A method of fabricating a semiconductor device, the method comprising:
   preparing a substrate comprising a plate and a bit line formed at a lower position than the plate;
   forming an insulation layer over the substrate;
   etching the insulation layer to form a first contact hole exposing a surface of the plate and a second contact hole having a larger depth than the first contact hole above the bit line;
   forming a first sacrificial layer over the insulation layer, the first contact hole, and the second contact hole;
   forming a second sacrificial layer over the substrate and filled in the first contact hole;
   exposing the first sacrificial layer at a bottom of the second contact hole while having the second sacrificial layer remain in the first contact hole;
   etching the exposed first sacrificial layer at the bottom of the second contact hole while the remaining second sacrificial layer over the first sacrificial layer in the first contact hole is partially etched such that the first sacrificial layer at a bottom of the first contact hole is not etched; and
   etching the remaining insulation layer to expose a surface of the bit line while remaining second sacrificial layer in the first contact hole is etched but a portion of the first sacrificial layer under the remaining second sacrificial layer in the first contact hole is not etched.

10. The method of claim 9, wherein the first sacrificial layer comprises a nitride-based layer, and the second sacrificial layer comprises an oxide-based layer.

11. The method of claim 10, wherein the second sacrificial layer comprises an undoped silicate glass (USG) using a plasma enhanced chemical vapor deposition (PECVD) method.

12. The method of claim 11, wherein exposing the first sacrificial layer at the bottom of the second contact hole while having the second sacrificial layer remain in the first contact hole comprises wet etching or dry etching the second sacrificial layer.

13. The method of claim 12, wherein the wet etching comprises using deionized water ($H_2O$) and hydrogen fluoride (HF) mixed at a ratio ranging approximately 15-25:1.

14. The method of claim 9, wherein the first sacrificial layer is formed to substantially the same thickness over surfaces of the first contact hole and the second contact hole.

15. The method of claim 14, wherein the first sacrificial layer is formed to a thickness ranging from approximately 100 Å to approximately 300 Å.

16. The method of claim 9, wherein etching the insulation layer to form the first contact hole exposing the surface of the plate and the second contact hole having the larger depth than the first contact hole comprises:

forming a hard mask pattern over the insulation layer; and etching the insulation layer to form the first contact hole and the second contact hole at substantially the same time using the hard mask pattern as an etch barrier.

17. The method of claim 16, wherein the hard mask pattern comprises one selected from a group consisting of nitride, silicon rich oxynitride, polysilicon, amorphous carbon, and tungsten.

18. The method of claim 17, wherein etching the insulation layer to form the first contact hole exposing the surface of the plate and the second contact hole having the larger depth than the first contact hole and etching the remaining insulation layer to expose the surface of the bit line comprise using an etch gas including oxygen ($O_2$), fluoroform ($CHF_3$) and $C_4F_6$.

19. The method of claim 18, wherein a flow rate of the $CHF_3$ ranges from approximately 30 sccm to approximately 50 sccm, a flow rate of the $C_4F_6$ ranges from approximately 80 sccm to approximately 150 sccm, and a flow rate of the $O_2$ ranges from approximately 1 sccm to approximately 5 sccm.

20. The method of claim 17, wherein etching the exposed first sacrificial layer comprises applying a top power of approximately 1,000 W or greater and a bottom power of approximately 300 W or less, and using one of a gas including $O_2$ and $CF_4$ in which the $O_2$ flows at a rate ranging from approximately 10 sccm to approximately 30 sccm and the $CF_4$ flows at a rate ranging from approximately 50 sccm to approximately 120 sccm and another gas including $O_2$ and $NF_3$ in which the $O_2$ flows at a rate ranging from approximately 10 sccm to approximately 30 sccm and the $NF_3$ flows at a rate ranging from approximately 50 sccm to approximately 120 sccm.

* * * * *